United States Patent
Hatakeyama

(10) Patent No.: US 10,782,327 B2
(45) Date of Patent: Sep. 22, 2020

(54) POWER SUPPLY SYSTEM, POWER CONTROL DEVICE, AND POWER SUPPLY DEVICE

(71) Applicant: Panasonic Intellectual Property Management Co., Ltd., Osaka (JP)

(72) Inventor: Takeshi Hatakeyama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 440 days.

(21) Appl. No.: 15/418,029

(22) Filed: Jan. 27, 2017

(65) Prior Publication Data

US 2017/0237266 A1    Aug. 17, 2017

(30) Foreign Application Priority Data

Feb. 16, 2016  (JP) ................. 2016-026617
Dec. 20, 2016  (JP) ................. 2016-246084

(51) Int. Cl.
*G01R 21/00* (2006.01)
*G01R 21/133* (2006.01)
(Continued)

(52) U.S. Cl.
CPC ............. *G01R 21/133* (2013.01); *H02J 1/10* (2013.01); *H02J 1/14* (2013.01); *H02J 3/00* (2013.01); *H02J 4/00* (2013.01); *B64D 2221/00* (2013.01)

(58) Field of Classification Search
CPC .. G01R 21/00; B64D 47/00; H02J 1/00; H02J 7/00; H02J 4/00; H01J 1/00
(Continued)

(56) References Cited

U.S. PATENT DOCUMENTS 6,018,690 A    1/2000   Saito et al.
6,301,674 B1  10/2001   Saito et al.
(Continued)

FOREIGN PATENT DOCUMENTS

JP   10-094199    4/1998
JP   4027095 B   12/2007
(Continued)

*Primary Examiner* — Rexford N Barnie
*Assistant Examiner* — Joseph N Inge
(74) *Attorney, Agent, or Firm* — McDermott Will & Emery LLP

(57) ABSTRACT

A power supply system includes a power control device and a power supply device. The power control device includes a first controller, a power measurement circuit, and a first communication circuit. The power measurement circuit measures power being supplied to the power supply device. The first controller calculates additionally suppliable power based on the power being supplied and selects one operation mode based on the additionally suppliable power. The first communication circuit transmits the operation mode selected to the power supply device. The power supply device includes a second controller, a power converter circuit, and a second communication circuit. The second communication circuit receives the operation mode selected. The second controller outputs a condition of supply power indicating electric power supplied, to the power converter circuit. The power converter circuit converts electric power based on the condition of supply power, and supplies the electric power converted to an external device.

6 Claims, 5 Drawing Sheets

(51) Int. Cl.
*H02J 1/10* (2006.01)
*H02J 1/14* (2006.01)
*H02J 3/00* (2006.01)
*H02J 4/00* (2006.01)

(58) Field of Classification Search
USPC .......................................................... 307/24
See application file for complete search history.

(56) References Cited

U.S. PATENT DOCUMENTS

| | | |
|---|---|---|
| 2012/0139472 A1 | 6/2012 | Ishibashi |
| 2013/0207484 A1* | 8/2013 | Okuzono ................ H02J 3/005 307/115 |
| 2014/0236375 A1* | 8/2014 | Ikeda ........................ H02J 3/32 700/295 |
| 2014/0253013 A1 | 9/2014 | Ishibashi |
| 2015/0229146 A1 | 8/2015 | Ishibashi |
| 2015/0263638 A1* | 9/2015 | Yang ........................ H02M 7/04 363/125 |

FOREIGN PATENT DOCUMENTS

| | | |
|---|---|---|
| JP | 2008-259254 | 10/2008 |
| JP | 2008259254 A * | 10/2008 |
| JP | 2010-193562 | 9/2010 |
| JP | 2012-120401 | 6/2012 |
| WO | 2001/039348 | 5/2001 |
| WO | 2013/042308 | 3/2013 |

* cited by examiner

FIG. 5

| Operation modes | Conditions of supply power |
|---|---|
| Mode 1 | 0W |
| Mode 2 | 20W |
| Mode 3 | 40W |
| Mode 4 | 80W |

FIG. 6

| Operation modes | Conditions of supply power | |
| | Battery-driven external device | Not battery-driven external device |
|---|---|---|
| Mode 1 | 0W | 0W |
| Mode 2 | 0W | 20W |
| Mode 3 | 40W | 40W |
| Mode 4 | 80W | 80W |

POWER SUPPLY SYSTEM, POWER CONTROL DEVICE, AND POWER SUPPLY DEVICE

BACKGROUND

1. Technical Field

The present disclosure relates to a power supply system supplying electric power to an external device, and to a power control device and a power supply device in the power supply system.

2. Description of the Related Art

Some of aircrafts, ships, and railway vehicles are equipped with power outlets at their seats for passengers. A passenger connects an electronic device such as a mobile terminal device to a power outlet to supply electric power to the electronic device.

A system that distributes electric power to multiple external devices may limit the amount of electric power usable for users, and thus some power distribution systems have been devised that limit the amount of electric power supplied to multiple power outlets (refer to PTL 1 for example). In such a power distribution system, which is unable to supply electric power exceeding its maximum supply capacity, when the total power consumed at multiple power outlets increases, the system controls not to supply electric power to the remaining power outlets to prevent an increase in a supply of electric power.

CITATION LIST

PTL
PTL 1 WO 2013/042308

SUMMARY

The present disclosure provides a power supply system, a power control device, and a power supply device with higher usability for users.

A power supply system according to an embodiment of the present disclosure includes a power control device and a power supply device. The power control device includes a first controller, a power measurement circuit, and a first communication circuit. The power measurement circuit measures power being supplied from a power generation device to the power supply device. The first controller calculates additionally suppliable power based on the power being supplied and selects one operation mode from three or more operation modes in which power conditions different from one another are determined, based on the additionally suppliable power. The first communication circuit transmits the operation mode selected to the power supply device. The power supply device includes a second controller, a power converter circuit, and a second communication circuit. The second communication circuit receives the operation mode selected, from the power control device. The second controller outputs a condition of supply power indicating electric power supplied to an external device, to the power converter circuit based on the operation mode selected. The power converter circuit converts electric power input from the power generation device, based on the condition of supply power, and supplies the electric power converted to the external device.

The power control device according to an embodiment of the present disclosure includes a controller, a power measurement circuit, and a communication circuit. The power measurement circuit measures power being supplied from a power generation device for generating electric power to the power supply device supplying electric power to the external device. The controller calculates additionally suppliable power based on the power being supplied and selects one operation mode from three or more operation modes in which power conditions different from one another are determined, based on the additionally suppliable power. The communication circuit transmits the operation mode selected to the power supply device.

The power supply device according to an embodiment of the present disclosure includes a controller, a power converter circuit, and a communication circuit. The communication circuit receives an operation mode output from the power control device for controlling electric power. The controller outputs a condition of supply power indicating electric power supplied to an external device, to the power converter circuit based on the operation mode received. The power converter circuit converts electric power input from a power generation device, based on the condition of supply power, and supplies the electric power converted to the external device.

The embodiment of the present disclosure supplies electric power to an external device based on an operation mode selected from three or more operation modes in which power conditions are different from one another, which increases usability for users.

BRIEF DESCRIPTION OF DRAWINGS

FIG. 5 shows the relationship between an operation mode and a condition of supply power according to the embodiment.

FIG. 6 shows the relationship between an operation mode and a condition of supply power taking the type of an external device in consideration, according to the embodiment.

DETAILED DESCRIPTION

Hereinafter, a detailed description is made of some embodiments with reference to the related drawings as appropriate. However, a detailed description more than necessary may be omitted, such as a description of a well-known item and a duplicate description for a substantially identical component, to avoid an unnecessarily redundant description and to allow those skilled in the art to easily understand the following description.

Note that the inventor provides accompanying drawings and the following description for those skilled in the art to well understand the disclosure and does not intend to limit the subjects described in the claims by the drawings and the description.

As described above, a power supply system that distributes electric power to multiple external devices may restrict electric power usable for users. Accordingly, when the total electric power consumed at multiple power outlets increases, the system controls not to supply electric power to the remaining power outlets to prevent an increase in a supply of electric power. However, when the total electric power being consumed exceeds a certain level, if the system always controls not to supply more electric power, it is inconvenient for a user who desires to newly use an external device.

According to an embodiment of the present disclosure, electric power is supplied to external devices based on an operation mode selected from three or more operation modes in which power conditions are different from one another.

Hereinafter, a description is made of a power supply system, a power control device, and a power supply device according to an embodiment.

Figure 1:
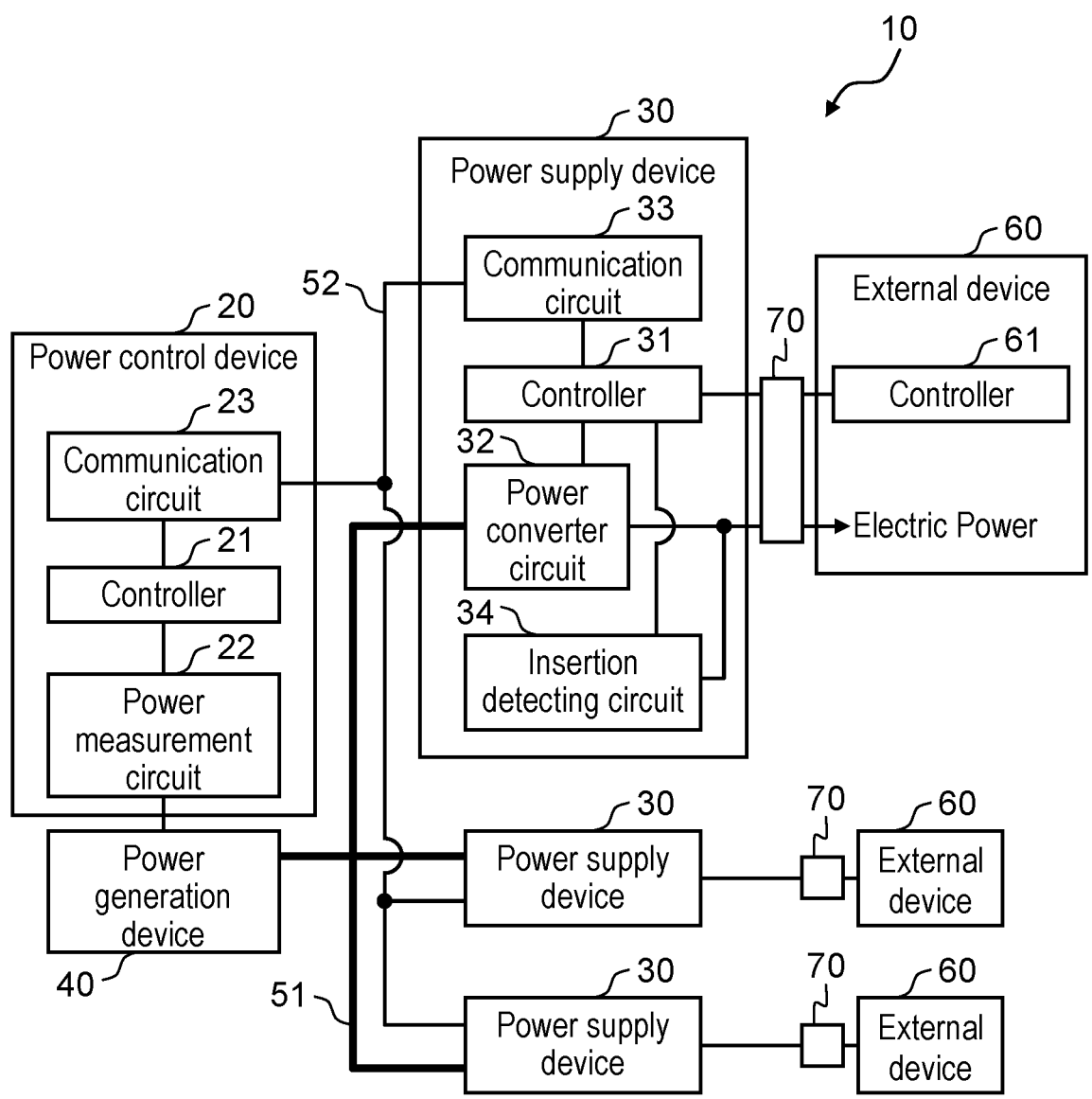
FIG. 1 illustrates a power supply system according to an embodiment.

FIG. 1 is a block diagram illustrating power supply system 10 according to an embodiment. Power supply system 10 includes power control device 20, power supply device 30, and power generation device 40.

Power generation device 40 is a power source, such as a power generator and a storage battery, that supplies electric power generated through power line 51 to power supply device 30. Power supply device 30 supplies electric power through connector 70 to external device 60 used by a user. Power control device 20 performs data communication with power supply device 30 through communication line 52 to control electric power that power supply device 30 supplies to external device 60. Connector 70 is capable of both power supply and data communication, such as a USB (universal serial bus) connector. Power supply device 30 performs data communication with external device 60 connected to connector 70. Here, connector 70 may have a form like a home-use wall socket.

Figure 2:
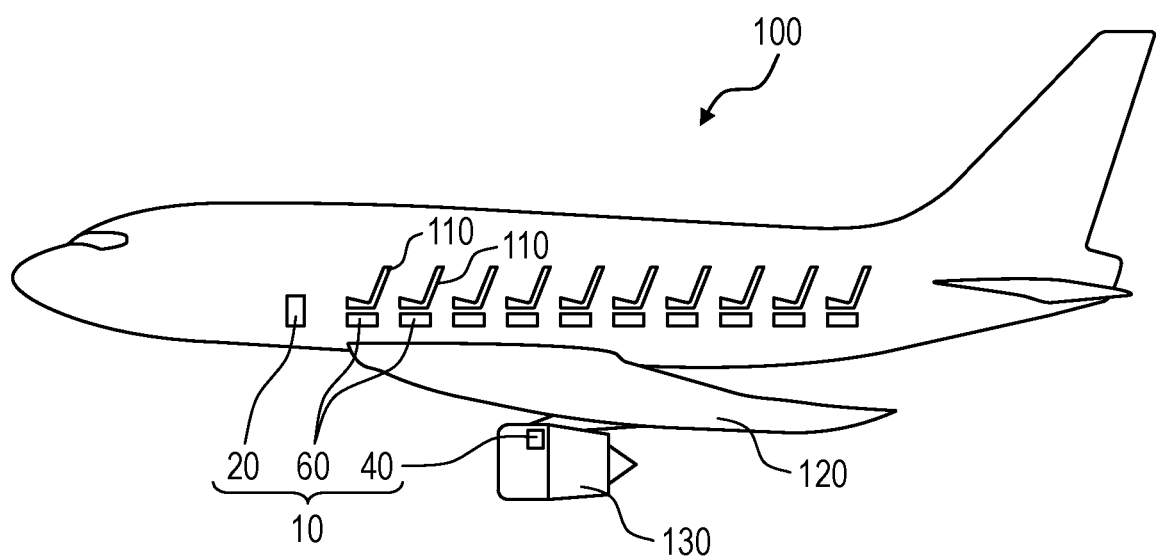
FIG. 2 illustrates an aircraft according to the embodiment.

FIG. 2 is a schematic diagram illustrating aircraft 100, an example of a vehicle equipped with power supply system 10 according to the embodiment. FIG. 2 shows aircraft 100 partly in a perspective manner to be easily understood.

In the example of aircraft 100 shown in FIG. 2, power generation device 40 is a power generator. Wing 120 of aircraft 100 is equipped with engine 130. In this example, power generation device 40, placed inside or near engine 130, converts part of the energy generated by engine 130 to electricity and outputs it. Here, power generation device 40, placed inside or near an APU (auxiliary power unit) used as auxiliary power supply during parking for example, may convert part of energy generated by the APU to electricity.

Aircraft 100 is equipped with multiple seats 110 for passengers being seated. Power supply device 30 and connector 70 are provided for each specific group of seats 110. For example, a set of power supply device 30 and connector 70 is provided for each double-seat (two seats) row and for each triple-seat (three seats) row. A passenger as a user connects external device 60 (e.g., a mobile terminal device) to connector 70 to supply electric power from power supply device 30 to external device 60. Note that power supply device 30 and connector 70 may be provided at each seat 110.

FIG. 1 shows that power control device 20 includes controller 21, power measurement circuit 22, and communication circuit 23. Power supply device 30 includes controller 31, power converter circuit 32, communication circuit 33, and insertion detecting circuit 34. Controller 21, a CPU (central processing unit) for example, controls operation of entire power control device 20 while performing data communication with power supply device 30 to control the operation of entire power supply system 10. Controller 31, a CPU for example, controls operation of entire power control device 30 while performing data communication with power supply device 20.

Here, assumption is made that external devices 60 are connected to some of multiple power supply devices 30 and that power supply device 30 is supplying electric power to respective external devices 60. Power measurement circuit 22 measures electric power that power generation device 40 is currently supplying to multiple power supply devices 30 and outputs the result to controller 21. Power measurement circuit 22, including a current sensor for example, determines the value of electric power from the value of a current output from power generation device 40.

Controller 21 calculates the value of additionally suppliable power based on the value of electric power currently being supplied measured by power generation device 40. How to determine the value of additionally suppliable power is described later. Controller 21 selects one operation mode from three or more operation modes in which power conditions different from one another are determined, based on the additionally suppliable power calculated. Communication circuit 23 transmits the operation mode selected by controller 21 to power supply device 30.

Communication circuit 33 of power supply device 30 receives the operation mode output from power control device 20. When a user connects new external device 60 to connector 70, insertion detecting circuit 34 detects that the connector of external device 60 has been inserted into connector 70 and outputs a signal to controller 31. Controller 31 outputs a condition of supply power that indicates electric power supplied to external device 60 newly connected, based on the operation mode received by communication circuit 33, to power converter circuit 32. Power converter circuit 32 converts the electric power input from power generation device 40 based on the condition of supply power, and supplies the resulting electric power to external device 60. This operation supplies electric power to external device 60 newly connected.

In this example, power generation device 40 outputs AC electric power. Power converter circuit 32 is an AC-AC converter or AC-DC converter for example. Alternatively, they may be mixed. If power generation device 40 outputs DC electric power, power converter circuit 32 may be a DC-AC converter or DC-DC converter for example.

Figure 3:
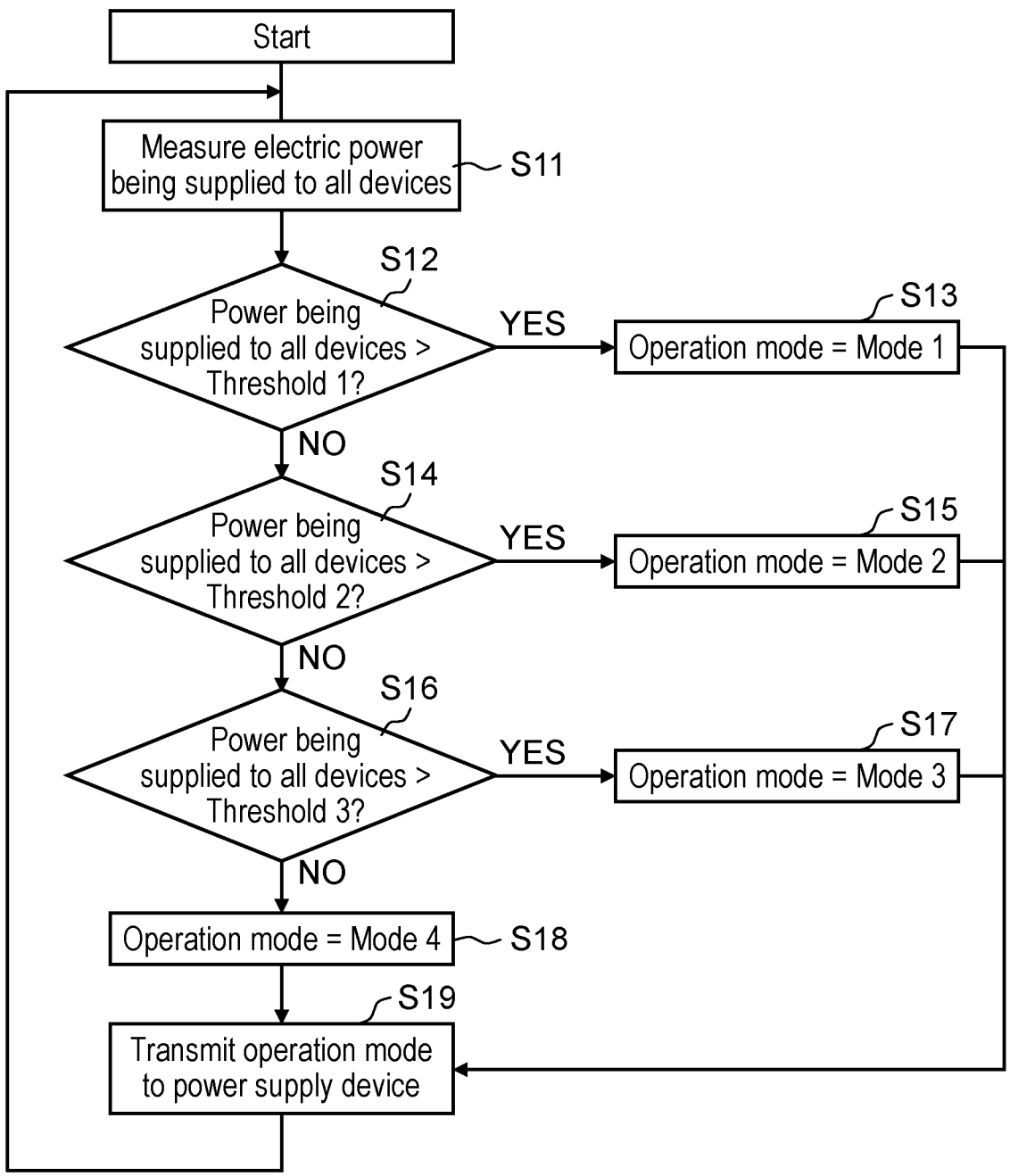
FIG. 3 is a flowchart illustrating operation of a power control device according to the embodiment.
Figure 4:
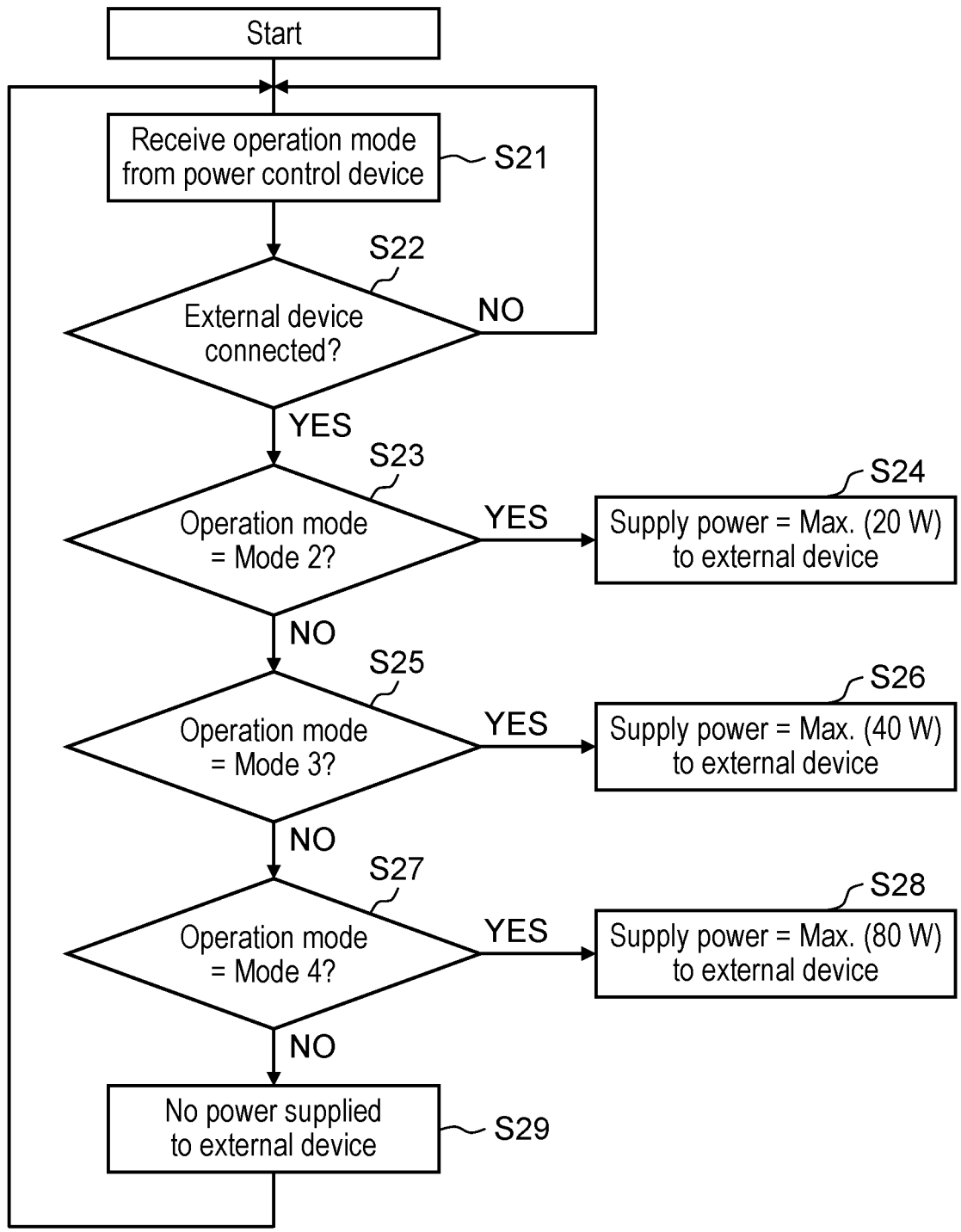
FIG. 4 is a flowchart illustrating operation of a power supply device according to the embodiment.

Next, a more detailed description is made of operation of power control device 20 and power supply device 30. FIG. 3 is a flowchart illustrating operation of power control device 20. FIG. 4 is a flowchart illustrating operation of power supply device 30. FIG. 5 shows the relationship between an operation mode and a condition of supply power. As described above, power measurement circuit 22 of power control device 20 measures electric power that power generation device 40 is currently supplying to all of multiple power supply devices 30 (step S11). Controller 21 determines whether or not the power currently being supplied to all of multiple power supply devices 30 is larger than threshold 1 (step S12). This example satisfies threshold 1>threshold 2>threshold 3.

If the power currently being supplied to all of multiple power supply devices 30 is larger than threshold 1 (yes in step S12), the maximum or its neighboring value of electric power that power generation device 40 can output is currently being supplied, and thus controller 21 selects mode 1 as an operation mode (step S13). As shown in FIG. 5, mode 1 indicates the condition of supply power of 0 W, which does not permit supplying electric power to newly connected external device 60.

If the power currently being supplied to all of multiple power supply devices 30 is threshold 1 or smaller (no in step S12), controller 21 determines whether or not the power currently being supplied is larger than threshold 2 (step S14). If the power currently being supplied is larger than threshold 2 (yes in step S14), much electric power is already being supplied although the power currently being supplied is not the maximum value of electric power that power generation device 40 can output, and thus controller 21 selects mode 2 (step S15). As shown in FIG. 5, mode 2 indicates the condition of supply power of 20 W, which permits supplying a small amount of electric power to newly connected external device 60.

If the power currently being supplied to all of multiple power supply devices 30 is threshold 2 or smaller (no in step S14), controller 21 determines whether or not the power currently being supplied is larger than threshold 3 (step S16). If the power currently being supplied is larger than threshold 3 (step S16 yes in), power generation device 40 has some reserve electric power, and thus controller 21 selects mode 3 as an operation mode (step S17). As shown in FIG. 5, mode 3 indicates the condition of supply power of 40 W, which permits supplying electric power to newly connected external device 60.

If the power currently being supplied to all of multiple power supply devices 30 is threshold 3 or smaller (no in step S16), power generation device 40 has sufficient reserve electric power, and thus controller 21 selects mode 4 as an operation mode (step S18). As shown in FIG. 5, mode 4 indicates the condition of supply power of 80 W, which permits supplying sufficient electric power to newly connected external device 60.

Communication circuit 23 of power control device 20 transmits the operation mode selected from modes 1 to 4 by controller 21, to power supply device 30 (step S19).

Next, as shown in FIG. 4, communication circuit 33 of power supply device 30 receives the operation mode output from power control device 20 (step S21). When a user connects new external device 60 to connector 70 and insertion detecting circuit 34 detects the connection (yes in step S22), controller 31 of power supply device 30 outputs the condition of supply power that indicates electric power supplied to newly connected external device 60, to power converter circuit 32 based on the operation mode received.

Controller 31 determines whether or not the operation mode received is mode 2 (step S23). If the operation mode received is mode 2 (yes in step S23), controller 31 outputs a condition of supply power indicating that the maximum value of suppliable power to newly connected external device 60 is 20 W, to power converter circuit 32 (step S24). Power converter circuit 32 supplies electric power to newly connected external device 60 within a supply power of 20 W.

If the operation mode received is not mode 2 (no in step S23), controller 31 determines whether or not the operation mode received is mode 3 (step S25). If the operation mode received is mode 3 (yes in step S25), controller 31 outputs a condition of supply power indicating that the maximum value of suppliable power to newly connected external device 60 is 40 W, to power converter circuit 32 (step S26). Power converter circuit 32 supplies electric power to newly connected external device 60 within a supply power of 40 W.

If the operation mode received is not mode 3 (no in step S25), controller 31 determines whether or not the operation mode received is mode 4 (step S27). If the operation mode received is mode 4 (yes in step S27), controller 31 outputs a condition of supply power indicating that the maximum value of suppliable power to newly connected external device 60 is 80 W, to power converter circuit 32 (step S28). Power converter circuit 32 supplies electric power to newly connected external device 60 within a supply power of 80 W.

If the operation mode received is not mode 4 (no in step S27), controller 31 determines the operation mode received is mode 1. If the operation mode received is mode 1, controller 31 outputs a condition of supply power indicating that the maximum value of suppliable power to newly connected external device 60 is 0 W, to power converter circuit 32 (step S29). Power converter circuit 32 does not supply electric power to newly connected external device 60 based on the condition of supply power.

In a case where the system always controls not to supply more electric power when the power currently being supplied to all of multiple power supply devices 30 exceeds a certain value, a user who desires to newly use external device 60 cannot use the device and will feel inconvenient. This embodiment, however, adjusts electric power supplied to newly connected external device 60 in a stepwise manner according to the power currently being supplied to all of multiple power supply devices 30. This prevents the power currently being supplied to all of the devices from approaching the maximum value of electric power that power generation device 40 can output, allowing electric power to be supplied to more external devices to increase usability for users.

Note that controller 31 may negotiate with controller 61 of external device 60 to change a condition of supply power within a range of the power condition defined by the operation mode selected. For example, in the operation mode of mode 4 (the condition of supply power=80 W), even if controller 61 of newly connected external device 60 requests for supplying a power of 40 W, if the external device 60 is operable even with 20 W, controller 31 may set a condition of supply power indicating that the maximum value of suppliable power to the external device 60 is 20 W. This further prevents the power currently being supplied to all of the devices from approaching the maximum value of electric power that power generation device 40 can output, allowing electric power to be supplied to more external devices to increase usability for users.

Besides, controller 31 may determine the type of newly connected external device 60 to change a condition of supply power according to the type. For example, in a specific operation mode such as mode 2, if newly connected external device 60 is driven by a battery, suppliable power indicated by the condition of supply power may be reduced. Alternatively, the condition of supply power may be set so that electric power is not supplied to external device 60. This is because, with a battery remaining capacity, external device 60 can be driven by no or small amount of electric power supplied from power supply device 30.

FIG. 6 shows the relationship between an operation mode and a condition of supply power in an embodiment that changes the condition of supply power according to the type of external device 60. In the example shown in FIG. 6, with power generation device 40 having reserve electric power in modes 3 and 4 for example, the condition of supply power is the same regardless of whether or not newly connected external device 60 is driven by a battery. Meanwhile, with power generation device 40 having limited electric power in modes 1 and 2 for example, the condition of supply power is set to 0 W for a battery-driven device. This further prevents the power currently being supplied to all of the devices from approaching the maximum value of electric power that power generation device 40 can output, allowing electric power to be supplied to more external devices to increase usability for users.

Hereinbefore, the embodiments are described to exemplify the technology disclosed in this application. The technology of the disclosure, however, is not limited to these embodiments, but is applicable to other embodiments appropriately devised through modification, substitution, addition, and omission for example. Further, some components described in the embodiments can be combined to devise a new embodiment.

In the above-described example, an aircraft is exemplified as a vehicle equipped with power supply system 10, but such a vehicle is not limited to an aircraft. The technology of the present disclosure is also applicable to an automobile such as a bus, railway vehicle, and ship. The technology is further applicable to the architecture such as a house and a building.

In the above-described example, power control device 20 and power generation device 40 are separately provided; however, power generation device 40 may be contained in power control device 20 depending on the form of power supply system 10.

If power supply device 30 and external device 60 are compliant with USB Power Delivery (PD) for example and negotiation on supplying electric power can be made, power supply device 30 may negotiate with external device 60 on a condition of supply power within the maximum power value determined by an operation mode.

In the above-described example, the case is shown where power supply device 30 has four operation modes, but the number of operation modes is not limited to four and can be appropriately specified. The number may be two; however, three or more is desirable in order to increase usability for users.

As described hereinbefore, power supply system 10 according to an embodiment of the present disclosure includes power control device 20 and power supply device 30. Power control device 20 includes controller 21, power measurement circuit 22, and communication circuit 23. Power measurement circuit 22 measures electric power that power generation device 40 is supplying to power supply device 30. Controller 21 calculates additionally suppliable power based on the power being supplied, and selects one operation mode from three or more operation modes in which power conditions different from one another are determined, based on the additionally suppliable power. Communication circuit 23 transmits the operation mode selected to power supply device 30. Power supply device 30 includes controller 31, power converter circuit 32, and communication circuit 33. Communication circuit 33 receives the operation mode selected, from power control device 20. Controller 31 outputs a condition of supply power indicating electric power supplied to external device 60, to power converter circuit 32. Power converter circuit 32 converts the electric power input from power generation device 40 based on the condition of supply power, and supplies the resulting electric power to external device 60.

In an embodiment, power conditions determined for each of three or more operation modes mean suppliable power to external device 60, which may be different from one another between the three or more operation modes.

In an embodiment, controller 31 may negotiate with external device 60 to change the condition of supply power within a range of the power condition determined by the operation mode selected.

In an embodiment, controller 31 may determine the type of external device 60 to change a condition of supply power according to the type in a specific operation mode.

In an embodiment, if external device 60 is a battery-driven device, controller 31 may change a condition of supply power to that of a smaller amount of suppliable power than a case where external device 60 is not a battery-driven device, or to that of no power supplied.

Power control device 20 according to an embodiment of the present disclosure includes controller 21, power measurement circuit 22, and communication circuit 23. Power measurement circuit 22 measures electric power that power generation device 40 for generating electric power is supplying to power supply device 30 that supplies electric power to external device 60. Controller 21 calculates additionally suppliable power based on the power being supplied, and selects one operation mode from three or more operation modes in which power conditions different from one another are determined, based on the additionally suppliable power. Communication circuit 23 transmits the operation mode selected to power supply device 30.

Power supply device 30 according to an embodiment of the present disclosure includes controller 31, power converter circuit 32, and communication circuit 33. Communication circuit 33 receives the operation mode selected, from power control device 20 for controlling electric power. Controller 31 outputs a condition of supply power indicating electric power supplied to external device 60, to power converter circuit 32 based on the operation mode received. Power converter circuit 32 converts the electric power input from power generation device 40 based on the condition of supply power, and supplies the resulting power to external device 60.

In an embodiment, an operation mode may define suppliable power to external device 60.

In an embodiment, controller 31 may negotiate with external device 60 within a range of electric power determined by an operation mode.

In an embodiment, controller 31 may determine the type of external device 60 to change a condition of supply power according to the type of external device 60 in a specific operation mode.

In an embodiment, if external device 60 is a battery-driven device, controller 31 may change a condition of supply power to that of a smaller amount of suppliable power than a case where external device 60 is not a battery-driven device, or to that of no power supplied.

Hereinbefore, the description is made of some embodiments for exemplification of the technologies in the disclosure. For this purpose, detailed descriptions and accompanying drawings are provided. Accordingly, some components described in the detailed descriptions and accompanying drawings may include what is not essential for solving problems. Hence, the fact that such inessential components are included in the detailed descriptions and accompanying drawings does not mean that such inessential components are immediately acknowledged as essential.

The above-described embodiments are for exemplification of the technologies in the disclosure. Hence, the embodiments may undergo various kinds of change, substitution, addition, and/or omission within the scope of the claims and their equivalent technology.

INDUSTRIAL APPLICABILITY

The technology according to the present disclosure is particularly useful in the technical fields where electric power is distributed to multiple devices and is applicable to an aircraft, ship, railway vehicle, automobile, and the architecture for example.

What is claimed is:

1. A power supply system comprising:
   a power control device; and
   a power supply device for supplying an electric power to an external device based on one of three or more operation modes selected by the power control device, each operation mode providing the power supply device with a power condition indicating a value of maximum available electric power for the external device, the value being different from those of other operation modes,
   wherein the power control device includes a first controller, a power measurement circuit, and a first communication circuit,
   wherein the power measurement circuit measures power being supplied from a power generation device to the power supply device,
   wherein the first controller calculates additionally suppliable power based on the power being supplied to the power supply device and selects one operation mode from the three or more operation modes based on the additionally suppliable power,
   wherein the first communication circuit transmits the one operation mode to the power supply device,
   wherein the power supply device includes a second controller, a power converter circuit, and a second communication circuit,
   wherein the second communication circuit receives the one operation mode from the power control device,
   wherein the second controller outputs the power condition indicating the value of maximum available electric power based on the one operation modes, the power condition indicating the electric power supplied to the external device, and
   wherein the power converter circuit converts electric power from the power generation device, based on the power condition of electric power, and supplies the electric power to the external device,
   wherein the power control device includes a first set of three or more operation modes for a non-battery-driven external device, and a second set of three or more operation modes for a battery driven external device, and
   wherein the second controller determines whether the external device is the non-battery-driven external device or the battery-driven external device, and uses the first or second set of three or more operation modes based on the determination.

2. The power supply system of claim 1, wherein the second controller negotiates with the external device and changes the power condition of electric power within a range of the power condition determined by the operation mode selected.

3. The power supply system of claim 1, wherein the second controller determines a type of the external device and changes the power condition of electric power according to the type of the external device in a specific operation mode.

4. The power supply system of claim 3, wherein in a case in which the external device is a battery-driven device, the second controller changes the power condition of electric power to a smaller amount of suppliable power than a case in which the external device is not a battery-driven device, or to no power supplied in the specific operation mode.

5. The power supply system of claim 1, wherein the power converter circuit converts the electric power input from the power generation device based on the power condition from the second controller, and supplies to the external device the converted electric power within the electric power indicated by the power condition.

6. The power supply system of claim 1, wherein in a case in which the external device is the battery-driven external device, a total amount of suppliable power of all operation modes is smaller than a case in which the external device is the non-battery-driven external device.

* * * * *